(12) United States Patent
Lee et al.

(10) Patent No.: US 7,786,815 B2
(45) Date of Patent: Aug. 31, 2010

(54) APPARATUS AND METHOD FOR GENERATION OF NOISE SIGNAL

(75) Inventors: Seong-soo Lee, Suwon-si (KR); Oleg Popov, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1236 days.

(21) Appl. No.: 11/344,067

(22) Filed: Feb. 1, 2006

(65) Prior Publication Data

US 2006/0192624 A1 Aug. 31, 2006

(30) Foreign Application Priority Data

Feb. 1, 2005 (RU) ................ 2005102419

(51) Int. Cl.
*H03B 29/00* (2006.01)
(52) U.S. Cl. .................. 331/78; 327/164; 708/251; 708/250
(58) Field of Classification Search .......... 331/78; 327/164; 708/251, 250
See application file for complete search history.

(56) References Cited

U.S. PATENT DOCUMENTS

| 4,475,090 A | * | 10/1984 | Stern | 331/78 |
| 5,742,208 A | * | 4/1998 | Blazo | 331/23 |
| 6,061,702 A | * | 5/2000 | Hoffman | 708/251 |
| 6,072,823 A | * | 6/2000 | Takakusaki | 375/130 |
| 6,414,558 B1 | * | 7/2002 | Ryan et al. | 331/78 |

* cited by examiner

*Primary Examiner*—Joseph Chang
(74) *Attorney, Agent, or Firm*—Sughrue Mion, PLLC

(57) ABSTRACT

An apparatus and method for generation of a noise signal are provided. The apparatus includes a noise synthesizing module and a noise signal transfer module. The noise synthesizing module includes a voltage controlled oscillator, a phase frequency detector, a phase locked loop filter, and a reference generator which form a phase locked loop. An output signal of the reference generator is provided to a first phase-frequency input of the phase-frequency detector, and an output signal of the voltage controlled oscillator is provided to a second input of the phase-frequency detector. An output signal of the phase-frequency detector is provided to an input of the phase locked loop filter, and an output of the phase locked loop filter is provided to a frequency control input of the voltage controlled oscillator. The noise signal transfer module includes a sinusoidal generator and a frequency mixer having a first input which is provided with an output signal of the phase frequency detector and a second input which is provided with an output signal of the sinusoidal.

11 Claims, 2 Drawing Sheets

APPARATUS AND METHOD FOR GENERATION OF NOISE SIGNAL

CROSS-REFERENCE TO RELATED APPLICATIONS

This application claims priority from Russian Patent Application No. 2005-102419, filed on Feb. 1, 2005, the disclosure of which is incorporated herein in its entirety by reference.

BACKGROUND OF THE INVENTION

1. Field of the Invention

Apparatuses and methods consistent with the present invention relate to generation of a noise signal, and more particularly, generation of a noise signal in wireless transmitters and wireless receivers.

2. Description of the Related Art

Noise signal generators are utilized in various communication systems to provide integrity of pulse form and pulse sequence for carrying information.

Numerous different implementations of noise signal generators are known in the art. For example, a noise signal generator disclosed in Russian Patent Application RU94025065 (Scientific Research Institute of Electronics, May 27, 1996, H03B 29/00). This noise signal generator utilizes a pseudo-random sequence and a digital-to-analog converter. The main disadvantage of this noise signal generator is high current consumption in a case where a noise bandwidth is on the order of hundreds of MHz. The high current consumption may occur in logic elements whose through current grow tremendously fast as the frequency increases.

Russian Patent No. RU2174282 (Sep. 27, 2001 H03B 29/00) discloses pseudo-noise signal generator with an output signal spectrum allocated around the generator's clock frequency. A disadvantage of this noise signal generator is high current consumption in a case where an output pseudo-noise spectrum must several hundred MHz. Another disadvantage of this noise generator is unevenness of a spectrum's envelope due to a final length of a pseudo-random sequence used for pseudo-noise generation.

Russian Patent No. RU20031334263 discloses a noise generator which utilizes a capability of nonlinear deterministic systems to generate a chaotic signal. This noise generator could potentially find wide application in the field of wireless communications and remote control systems if not for some significant disadvantages specific to nonlinear deterministic systems, namely:

- a large power consumption caused by the necessity to support multi-frequency oscillations in system with strong nonlinearity, and
- a need for a large resonator system which is capable of working in only in a dedicated frequency band and is not flexible to tuning.

SUMMARY OF THE INVENTION

It is an aspect of the present invention to provide a flexible and low current consuming apparatus for generation of a noise signal in different frequency bands.

According to an aspect of the present invention, there is provided a noise signal generating apparatus comprising a noise signal synthesizing module and a noise signal transfer module. The noise signal synthesizing module comprises a voltage controlled oscillator (VCO), a phase-frequency detector, a phase locked loop (PLL) filter, and a reference generator which together form a PLL. The noise signal transfer module comprises a sinusoidal generator and a frequency mixer having a local oscillator input connected to an output signal of the sinusoidal generator and a signal input connected to an output signal of the phase-frequency detector of the noise synthesizing module.

The phase-frequency detector compares a reference signal output by the reference generator with a periodic output signal of the voltage controlled oscillator to determine a phase difference between the reference signal and the output signal of the voltage controlled oscillator, and if a difference in phase is greater than a threshold, generates a pulse of proper polarity and amplitude to compensate the phase difference. In a stationary state, the output signal of the phase-frequency detector is a sequence of short pulses fixing the voltage controlled oscillator phase within some limits. This output signal of the phase-frequency detector has a very wide spectrum and is applied to the noise signal transfer module, and more particularly, to a signal input of the frequency mixer to transfer the spectrum of the output signal of the phase-frequency detector to the frequency of the output signal the sinusoidal generator.

For proper system operation, it is important that the PLL, formed by the VCO, the phase-frequency detector, the PLL filter, and the reference generator, is maintained in stationary state and output pulses of the phase-frequency detector are of short duration. Further, polarities of these pulses should be of equal probability.

The VCO may be used in the noise signal transfer module as the sinusoidal generator such that the output signal of the VCO is directly provided to the frequency mixer instead of the sinusoidal output signal of the sinusoidal generator.

According to another aspect of the present invention, there is provided, a method of generating a noise signal, the method comprising: generating a periodic signal using a VCO; stabilizing a phase of the periodic signal of the VCO using a PLL; applying the periodic signal generated by the VCO and a reference signal to inputs of a phase-frequency detector of the PLL; and applying an output signal of the phase-frequency detector and a sinusoidal signal to first and second inputs of a frequency mixer to generate a noise signal whose spectrum central frequency is a frequency of the sinusoidal signal.

The PLL comprises the VCO, a reference generator which generates the reference signal, a PLL filter and the phase-frequency detector, and the output signal of the frequency detector is passed through the PLL filter and provided to a control input of the voltage controlled oscillator to stabilize the periodic signal generated by the voltage controlled oscillator.

The sinusoidal signal may be the periodic signal generated by the voltage controlled oscillator.

The phase-frequency detector compares the reference signal output by the reference generator with the periodic signal generated by the voltage controlled oscillator to determine a phase difference between the reference signal and the periodic signal, and if the phase difference is greater than a threshold, generates a pulse signal of proper polarity and amplitude to compensate the phase difference As a result, the noise output signal of frequency mixer has a spectrum which is allocated around the frequency of the output signal of the sinusoidal generator.

Accordingly, the present invention provides a method of flexibly generating a noise-like signal in different frequency bands using the noise synthesizing module including the PLL formed by the VCO, the phase-frequency detector, the PLL filter, and the reference generator, and the noise signal transfer module to transfer a noise signal generated by the PLL system to any desirable frequency.

Further, the present invention provides an apparatus capable of flexibly generating a noise signal in different frequency bands and consuming a small current.

BRIEF DESCRIPTION OF THE DRAWINGS

The above and/or other aspects and features of the present invention will be more apparent by describing certain exemplary embodiments of the present invention with reference to the accompanying drawings, in which.

DETAILED DESCRIPTION OF EXEMPLARY EMBODIMENTS OF THE INVENTION

Exemplary embodiments of the present invention will be described in detail with reference to the drawings.

Figure 1:
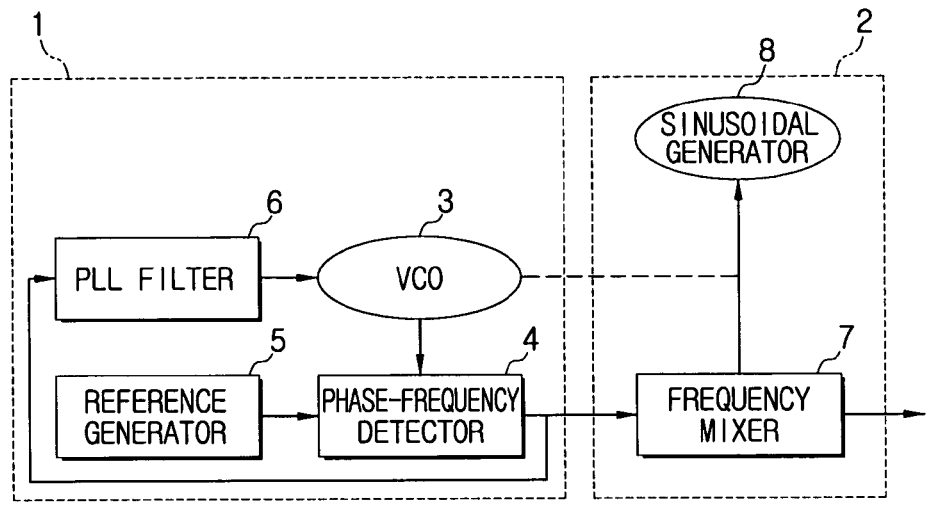
FIG. 1 is a block diagram of a noise signal generating apparatus according to an exemplary embodiment of the present invention.

FIG. 1 is a block diagram of a noise signal generator according to an exemplary embodiment of the present invention. The noise signal generator comprises a noise signal synthesizing module(1) and noise signal transfer module(2).

The noise signal synthesizing module comprises a VCO 3, a frequency-phase detector 4, a PLL filter 6, and a reference generator 5, which form a PLL.

The noise signal transfer module comprises a frequency mixer (or phase modulator) 7 and a sinusoidal generator 8.

The VCO 3 generates a sinusoidal output signal having a frequency which depends on a control signal. Stability, spectral and noise performance of the VCO 3 in a free run state may be imprecise. The reference generator 5 generates a periodic reference signal having good stability. The PLL uses the reference signal output by the reference generator 5 to stabilize a frequency of the output signal of the VCO 3. For this purpose, the output signal of VCO 3 is applied to one input of the phase-frequency detector 4 while the reference signal is applied to another input of the phase-frequency detector 4. The phase-frequency detector 4 outputs a noise signal which is passed through the PLL filter 6 and the filtered noise signal is input to the VCO 3 as the control signal.

Parameters of the phase-frequency detector 4, the PLL filter 6, and the VCO 3 are chosen according to a method well known in the art from PLL theory to set the oscillation phase of the VCO 3 based on the oscillation phase of the reference signal.

The PLL system provides amplitude noise on the output signal of the phase-frequency detector 4. The amplitude noise arises in the PLL system on the output signal of the phase-frequency detector 4 in a state of locking the phase of the VCO 3 as a result of jitter of the VCO 3 with respect to the phase of the reference signal output by the reference generator 5. The phase-frequency detector 4 compares the phase of the reference signal output by the reference generator 5 with the phase of the output signal of the VCO 3. If a phase difference is greater than a set threshold of the phase-frequency detector 4, the output signal of the phase frequency detector 4 adjusts the phase of the output signal of the VCO 3. Since phase jitter of the VCO 3 is random, the output signal of phase-frequency detector 4 is random. Amplitude noise on the output signal of phase-frequency detector 4 is revealed as short pulses of current, whose amplitude, length and polarity are casual but limited as follows:

amplitude is limited with charge pump current of the phase-frequency detector 4;

length is limited with phase jitter of the PLL;

polarity is limited with an average phase difference deviation of the VCO and the reference generator from a stationary value, where probability of polarity (+) and (−) in stationary state is equal.

Spectral features of this amplitude noise are determined based on a length of the noise pulses and can be of a very wide band.

The noise output signal of the phase-frequency detector 4 is applied to an input of the frequency mixer 7 of the noise signal transfer module 2. A local oscillator input of the frequency mixer 7 is provided with a sinusoidal output signal of the sinusoidal generator 8. Alternatively, the local oscillator input of the frequency mixer 7 can be directly supplied with the output signal of the VCO 3. As a result, the frequency mixer 7 outputs a noise signal whose spectrum is allocated around a frequency of the output signal of the sinusoidal generator 8.

Figure 2:
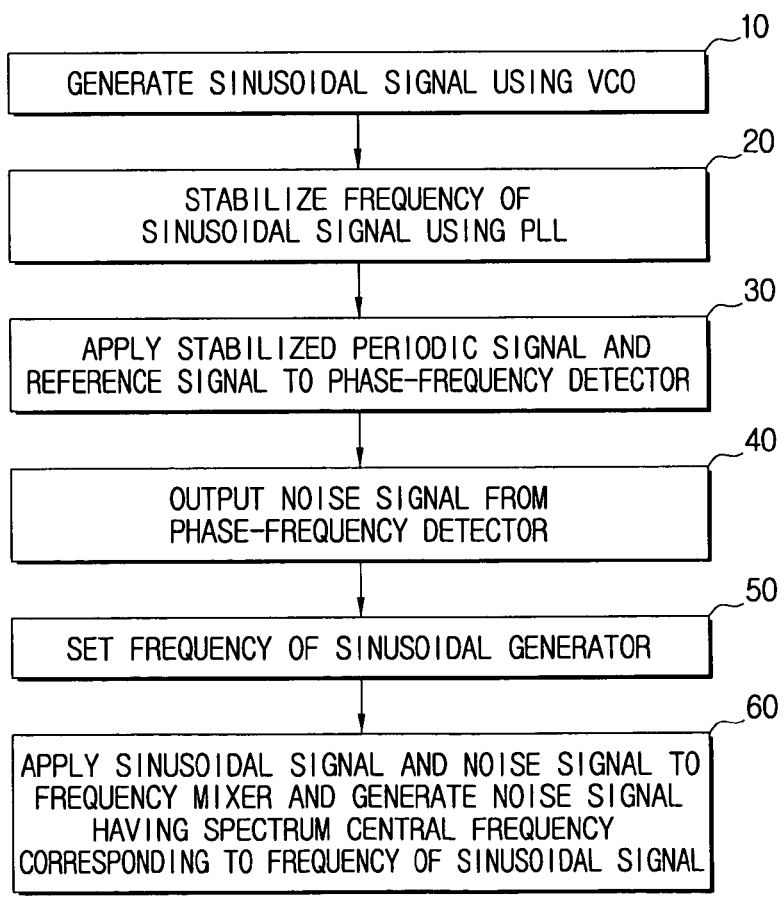
FIG. 2 is a flowchart illustrating a method of generating a noise signal according to an exemplary embodiment of the present invention.

FIG. 2 is a flowchart illustrating a method of generating a noise signal according to an exemplary embodiment of the present invention In operation 10, the VCO 3 generates a sinusoidal output signal. A phase of the sinusoidal output signal of the VCO is stabilized via the PLL by being locked to a phase of the reference signal of the reference signal generator 5 (operation 20). The reference signal of the reference generator 5 and the stabilized output signal of the VCO 3 are applied to inputs of the phase-frequency detector 4 (operation 30). The phase-frequency detector 4 outputs a signal which is passed through the PLL filter 6 and then provided to the VCO 3 as a control input.

In a stationary state, the output of the phase-frequency detector 4 is a noise signal (operation 40). A frequency of the sinusoidal signal of the sinusoidal generator is set in operation 50. The noise output signal of the phase-frequency detector 4 and the sinusoidal signal of the sinusoidal generator 8 are applied to a first input and a second (local oscillator) input of the frequency mixer 7 which outputs the noise signal having a spectrum central frequency allocated around the frequency of the sinusoidal signal (operation 60).

Figure 3:
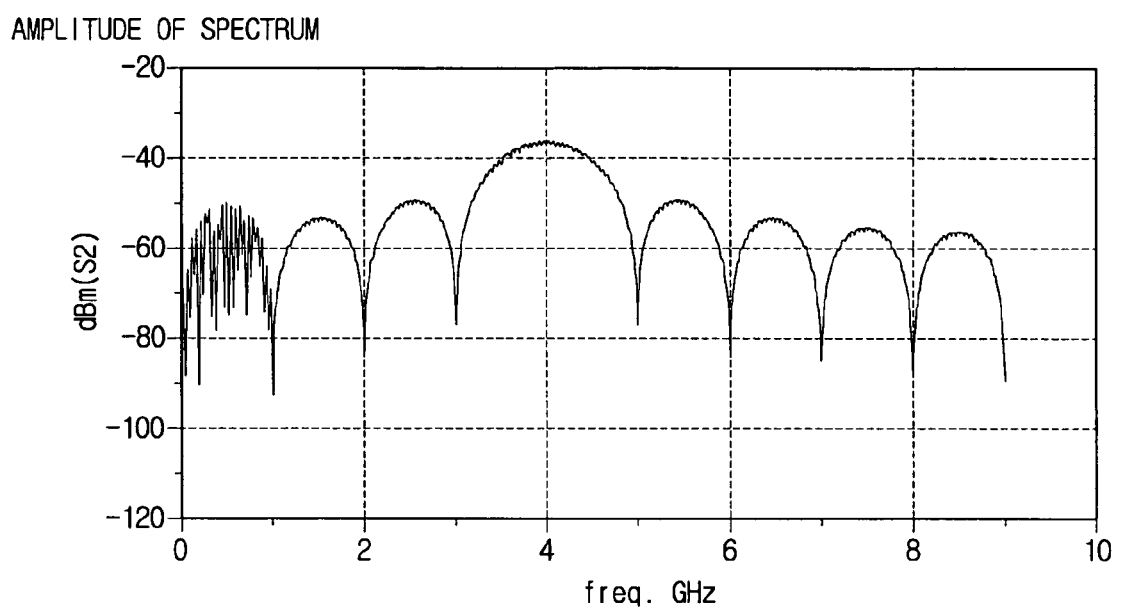
FIG. 3 is a waveform showing the signal outputted from a noise signal generating apparatus according to an exemplary embodiment of the present invention.

FIG. 3 is a waveform showing the signal outputted from a noise signal generating apparatus according to an exemplary embodiment of the present invention.

More specifically, FIG. 3 shows the waveforms of the noise signals outputted from the noise signal transfer module 2, and particularly from the frequency mixer 7.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and will not be construed as placing any limitation on the scope of the invention.

What is claimed is:

1. An apparatus for generation of noise signal, the apparatus comprising a noise signal synthesizing module and a noise signal transfer module, wherein the noise signal synthesizing module comprises a voltage controlled oscillator, a phase frequency detector, a phase locked loop filter, and a reference generator which form a phase locked loop, an output signal of the reference generator is provided to a first input of the phase-frequency detector, an output signal of the voltage controlled oscillator is provided to a second input of the phase-frequency detector, an output signal of the phase-frequency detector is provided to an input of the phase locked loop filter, and an output of the phase locked loop filter is provided to a frequency control input of the voltage controlled oscillator, and wherein the noise signal transfer module comprises a frequency mixer which generates a noise signal based on an output signal of the phase frequency detector and a signal provided to a local oscillator input of the frequency mixer.

2. The apparatus of claim 1, wherein the phase-frequency detector compares a reference signal output by the reference generator with an output signal of the voltage controlled oscillator to determine a phase difference between the reference signal and the output signal of the voltage controlled oscillator, and if the phase difference is greater than a threshold, generates a pulse signal of proper polarity and amplitude to compensate the phase difference.

3. The apparatus according to claim 2, wherein the noise signal transfer module further comprises a sinusoidal generator which generates a sinusoidal signal, and the sinusoidal signal is provided to the local oscillator input of the frequency mixer.

4. The apparatus according to claim 3, wherein the frequency mixer generates the noise signal which is in a stable state of short pulses having an amplitude, duration and polarity which are random.

5. The apparatus according to claim 4, wherein a polarity of the pulses of the noise signal is of equal probability.

6. The apparatus according to claim 1, wherein the output signal of the voltage controlled oscillator is provided to the local oscillator input of the frequency mixer.

7. A method of generating a noise signal, the method comprising:
generating a periodic signal using a voltage controlled oscillator;
stabilizing a phase of the periodic signal generated by the voltage controlled oscillator frequency using phase locked loop;
applying the periodic signal generated by the voltage controlled oscillator and a reference signal to inputs of a phase-frequency detector of the phase locked loop; and
applying an output signal of the phase-frequency detector and a sinusoidal signal to first and second inputs of a frequency mixer to generate a noise signal whose spectrum central frequency is a frequency of the sinusoidal signal.

8. The method according to claim 7, wherein the phase locked loop comprises the voltage controlled oscillator, a reference generator which generates the reference signal, a phase locked loop filter and the phase-frequency detector, and the output signal of the frequency detector is passed through the phase locked loop filter and provided to a control input of the voltage controlled oscillator to stabilize the periodic signal generated by the voltage controlled oscillator.

9. The method according to claim 8, wherein the sinusoidal signal is the periodic signal generated by the voltage controlled oscillator.

10. The method according to claim 8, wherein the sinusoidal signal is generated by a sinusoidal generator.

11. The method of claim 8, wherein the phase-frequency detector compares the reference signal output by the reference generator with the periodic signal generated by the voltage controlled oscillator to determine a phase difference between the reference signal and the periodic signal, and if the phase difference is greater than a threshold, generates a pulse signal of proper polarity and amplitude to compensate the phase difference.

* * * * *